United States Patent
Kawano

(10) Patent No.: US 9,368,703 B2
(45) Date of Patent: Jun. 14, 2016

(54) METHOD OF MANUFACTURING LIGHT EMITTING DEVICE

(71) Applicant: Nichia Corporation, Anan-shi, Tokushima (JP)

(72) Inventor: Yusuke Kawano, Anan (JP)

(73) Assignee: NICHIA CORPORATION, Anan-Shi (JP)

( * ) Notice: Subject to any disclaimer, the term of this patent is extended or adjusted under 35 U.S.C. 154(b) by 0 days.

(21) Appl. No.: 14/555,876

(22) Filed: Nov. 28, 2014

(65) Prior Publication Data

US 2015/0155457 A1 Jun. 4, 2015

(30) Foreign Application Priority Data

Nov. 29, 2013 (JP) ................. 2013-247170
Oct. 16, 2014 (JP) ................. 2014-211772

(51) Int. Cl.
| | |
|---|---|
| *H01L 21/00* | (2006.01) |
| *H01L 33/60* | (2010.01) |
| *H01L 33/52* | (2010.01) |
| *H01L 33/48* | (2010.01) |
| *H01L 25/075* | (2006.01) |
| *H01L 33/62* | (2010.01) |

(52) U.S. Cl.
CPC ............. *H01L 33/60* (2013.01); *H01L 25/0753* (2013.01); *H01L 33/486* (2013.01); *H01L 33/52* (2013.01); *H01L 33/62* (2013.01); *H01L 2924/0002* (2013.01); *H01L 2933/0033* (2013.01); *H01L 2933/0058* (2013.01)

(58) Field of Classification Search
CPC ............................ H01L 33/60; H01L 25/0753
USPC ........................................................... 438/27
See application file for complete search history.

(56) References Cited

U.S. PATENT DOCUMENTS

| | | | |
|---|---|---|---|
| 2005/0023548 A1 | 2/2005 | Bhat et al. | |
| 2008/0284315 A1* | 11/2008 | Tasumi et al. | 313/503 |
| 2010/0117099 A1* | 5/2010 | Leung | 257/88 |
| 2012/0235149 A1* | 9/2012 | Ochi | 257/59 |
| 2013/0010402 A1* | 1/2013 | Lee | H01G 9/15 361/523 |
| 2013/0256710 A1* | 10/2013 | Andrews et al. | 438/28 |
| 2013/0301257 A1* | 11/2013 | Britt | H01L 25/0753 362/231 |
| 2013/0328070 A1* | 12/2013 | Hussell et al. | 438/27 |
| 2015/0155459 A1* | 6/2015 | Ishihara et al. | 257/88 |

FOREIGN PATENT DOCUMENTS

| | | |
|---|---|---|
| JP | 2004-319939 | 11/2004 |
| JP | 2005-057265 | 3/2005 |

(Continued)

*Primary Examiner* — Moazzam Hossain
(74) *Attorney, Agent, or Firm* — Foley & Lardner LLP

(57) ABSTRACT

A method of manufacturing a light emitting device includes providing an insulating substrate having an electrically conductive member on a surface of the insulating substrate; after providing the insulating substrate, covering the electrically conductive member with a reflecting member by using electrodeposition or electrostatic coating; after covering the electrically conductive member with the reflecting member, insulating a portion of the electrically conductive member to form an insulating member; and singulating the substrate by cutting the substrate to form a plurality of singulated substrates, wherein the substrate is singulated such that, in each singulated substrate, the electrically conductive member is spaced apart from end portions of the singulated substrate.

13 Claims, 11 Drawing Sheets

(56) References Cited

FOREIGN PATENT DOCUMENTS

| | | |
|---|---|---|
| JP | 2011-228369 | 11/2011 |
| JP | 2012-060173 | 3/2012 |
| JP | 2012-227314 | 11/2012 |
| WO | WO 2011-099384 A1 | 8/2011 |

* cited by examiner

METHOD OF MANUFACTURING LIGHT EMITTING DEVICE

CROSS-REFERENCE TO RELATED APPLICATIONS

This application claims priority to Japanese Patent Application No. 2013-247170, filed on Nov. 29, 2013, and No. 2014-211772, filed on Oct. 16, 2014. The entire disclosures of Japanese Patent Application No. 2013-247170 and No. 2014-211772 are hereby incorporated herein by reference.

BACKGROUND

1. Technical Field

The present disclosure relates to a method of manufacturing a light emitting device which can be used for a display device, a luminaire, a display, a backlight light source for a liquid crystal display, and so forth.

2. Description of the Related Art

In recent years, various electronic components have been proposed and come into practical use, and higher performance is required for those components. This is also applied to the light emitting diodes and other light emitting devices. Particularly, in the fields of general lighting, on-vehicle lighting, or the like, requirements for higher performance have been increasing day by day, and further higher output, higher luminance, lower resistance, and higher reliability have been in demand. Further, while satisfying those performance requirements, operation on a commercial power supply system has also been demanded. A luminaire that uses a commercial power supply is required to comply with certain safety regulations, for example, those specified in JIS-C-8105-1. Particularly, in order to eliminate risks such as electric shock, the voltage that the light emitting device must withstand (hereinafter called the "withstand voltage") should be increased.

Conventionally, for the material of LED packages, ceramic substrates which have a high insulation resistance have been used; particularly, for optical semiconductors, alumina-based white substrates have generally been used. On the other hand, in portions to mount LED chips (also referred to as "light emitting elements"), electrically conductive patterns are provided. For example, a noble metal such as Au or Ag may be formed on a surface in such a pattern; in the case where electrolytic plating is employed, an electrically conductive pattern to apply potential becomes necessary. The electrically conductive pattern is exposed at an end portion or a back surface of the substrate to facilitate the supply of electricity from an external power supply.

However, conventional techniques have disadvantages as illustrated below. In recent years, further higher outputs have been in demand on light emitting devices. In order to realize a high output by supplying a large amount of current, an improvement in the heat dissipating property of the light emitting devices becomes important. Accordingly, for example, an LED (also referred to as a "light emitting device") may be mounted on a metal member which has high heat dissipating property, such as a heat sink.

For example, in JP2004-319939A, an Ag-plated layer which has a high reflectance is used for a reflecting surface, and thus obtains an improvement in the light extraction efficiency. However, in order to obtain an Ag plated surface which has a high reflectance, electrolytic plating method is needed to be used. However, in this case, the electrically conductive layer which serves as wiring for the electrolytic plating is exposed at a side surface of an insulating member, so that at the time of driving with the back surface of the insulating member brought into contact with the metal member, a short circuit due to creeping discharge may result.

Also in WO2011-099384, the surface of the electrically conductive member is covered with a reflecting member by using an electrodeposition method or electrostatic coating method, with which it is inevitable that the wiring for supplying voltage to the electrically conductive member is exposed at an end portion of the insulating member.

For this reason, in the case where a commercial power supply of an 200V system is used, the withstand voltage is required to satisfy various standards such as JIS. For example, in LEDs, the electrically conductive member located on a side surface of the substrate of the package or the like generally must be 1.5 mm or greater, more preferably 2 mm or greater, spaced apart from a metal member such as a heat sink. Accordingly, the thickness of the insulating substrate must be increased, which increases material cost and may result in a reduction of heat dissipation performance.

SUMMARY

One object of certain embodiments of the present invention is to provide a method of manufacturing a light emitting device which can secure the withstand voltage while having a reflecting layer with the use of a wiring disposed on the substrate, in view of the disadvantages described above.

A method of manufacturing a light emitting device according to an embodiment of the present invention includes providing an insulating substrate having an electrically conductive member on a surface of the insulating substrate; after providing insulating substrate, covering the electrically conductive member with a reflecting member by using electrodeposition or electrostatic coating; after the covering the electrically conductive member, insulating at least a portion of the electrically conductive member to form an insulating member; and singulating the substrate by cutting. Thus, the electrically conductive member is spaced apart from an end portion of each singulated substrate.

According to the above method of manufacturing a light emitting device, a reflecting member may be efficiently applied on a desired location of the light emitting device while securing required amount of withstand voltage, so that light from a light emitting element can be extracted to the outside efficiently.

DETAILED DESCRIPTION OF THE INVENTION

Figure 1:
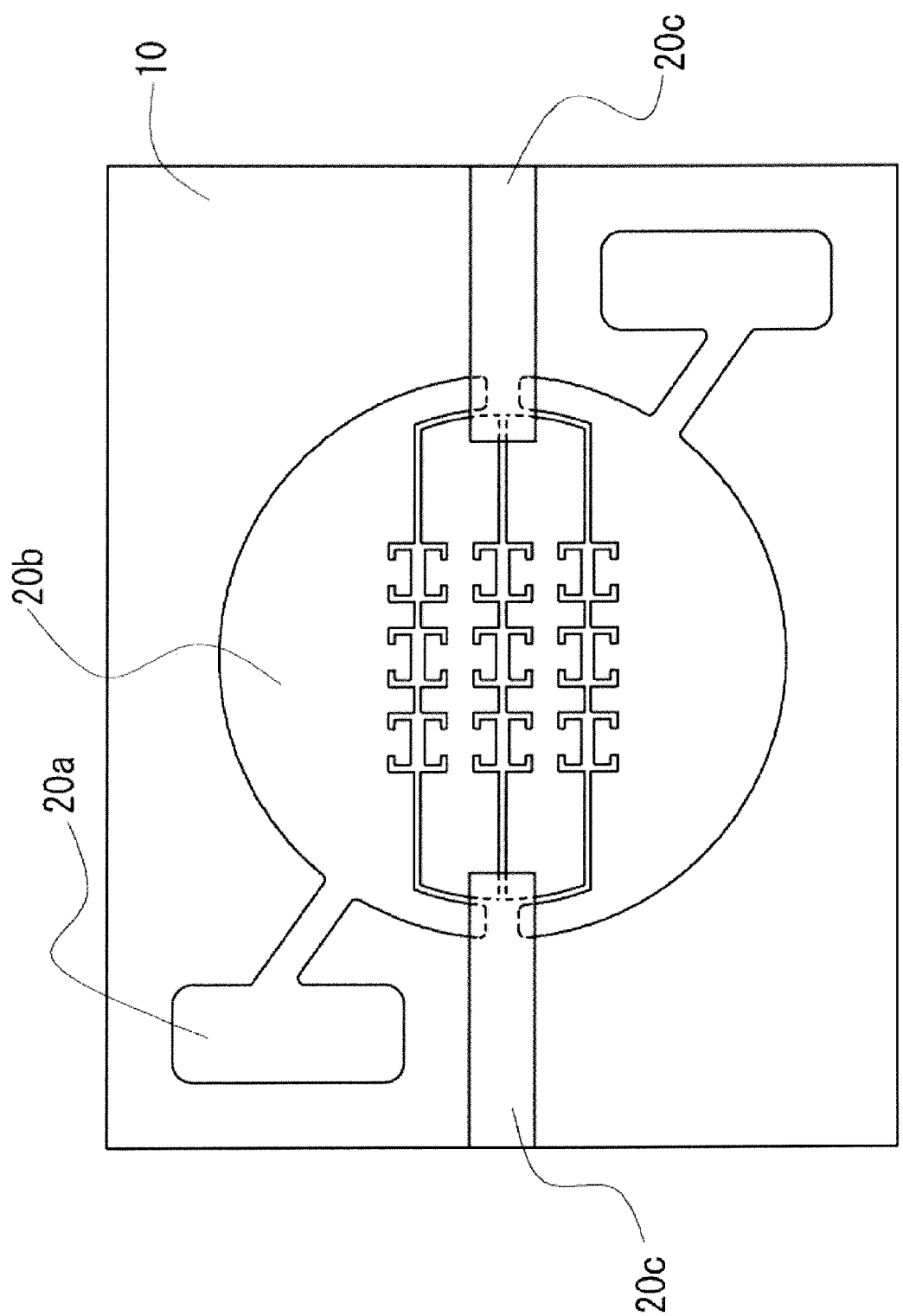
FIG. 1 is an operation diagram of a method of manufacturing a light emitting device according to an embodiment of the present invention, illustrating providing an insulating substrate.
Figure 2:
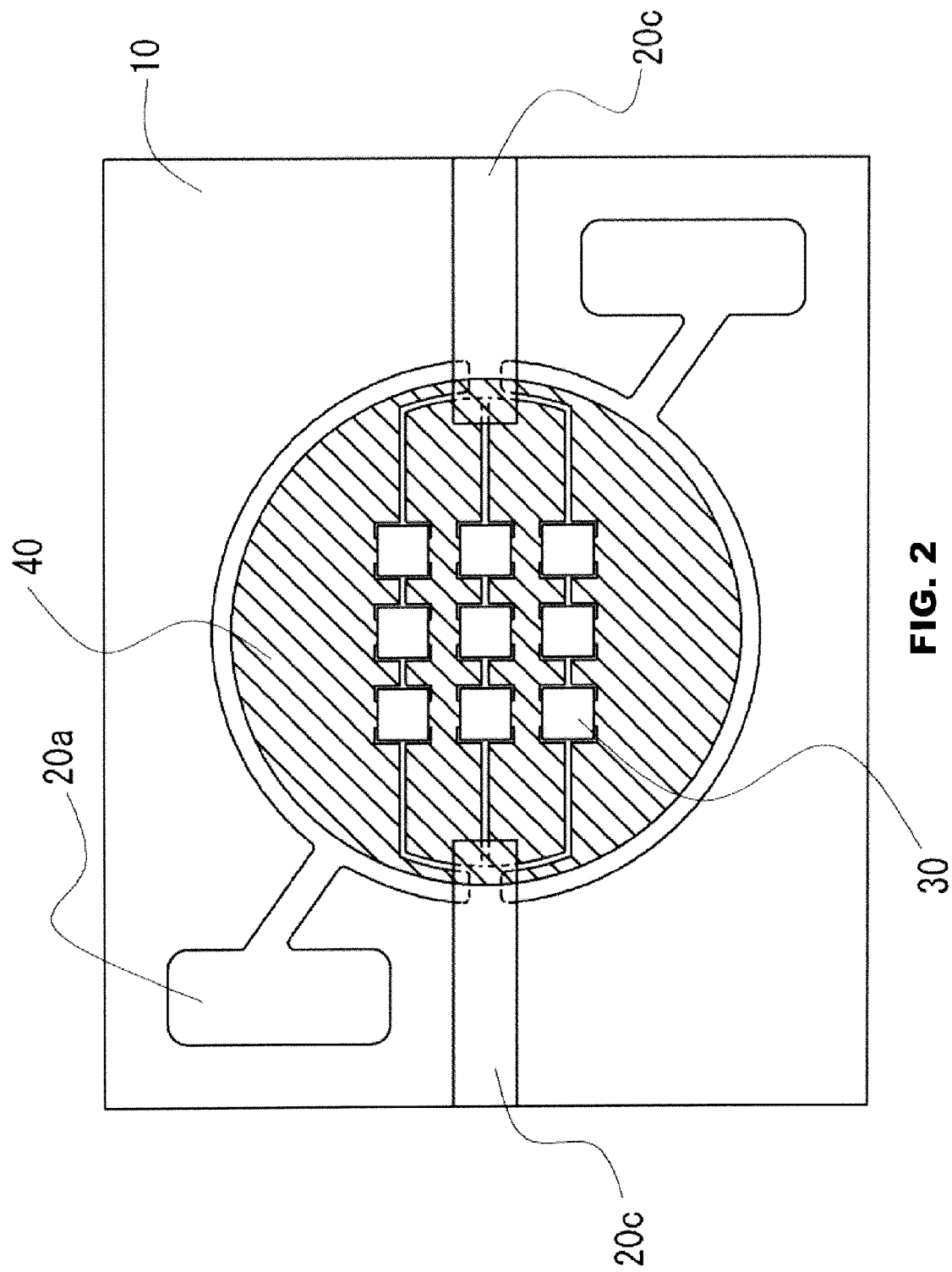
FIG. 2 is an operation diagram of a method of manufacturing a light emitting device according to an embodiment of the present invention, illustrating covering the electrically conductive member.
Figure 3:
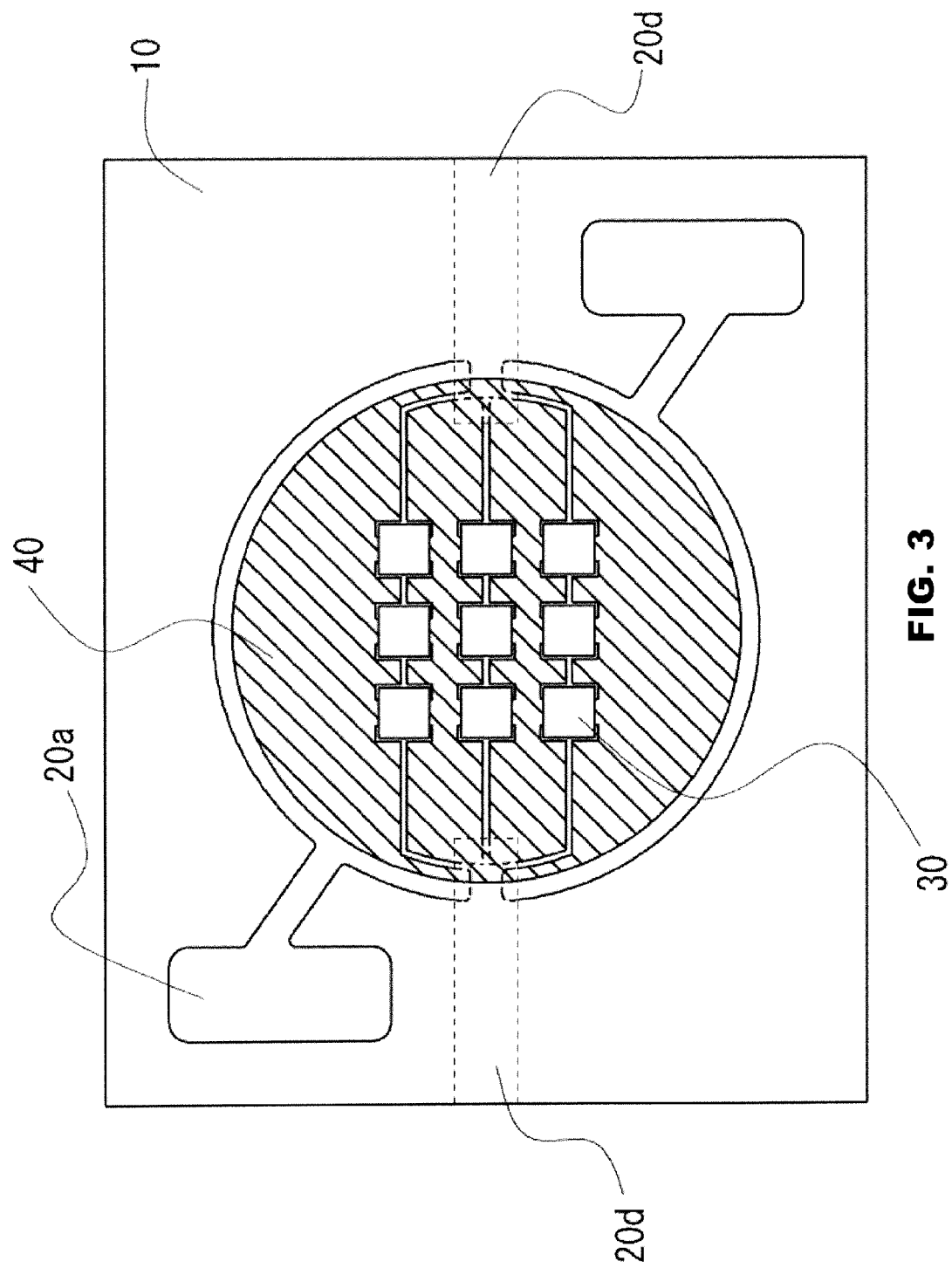
FIG. 3 is an operation diagram of a method of manufacturing a light emitting device according to an embodiment of the present invention, illustrating insulating at least a portion of the electrically conductive member.
Figure 4:
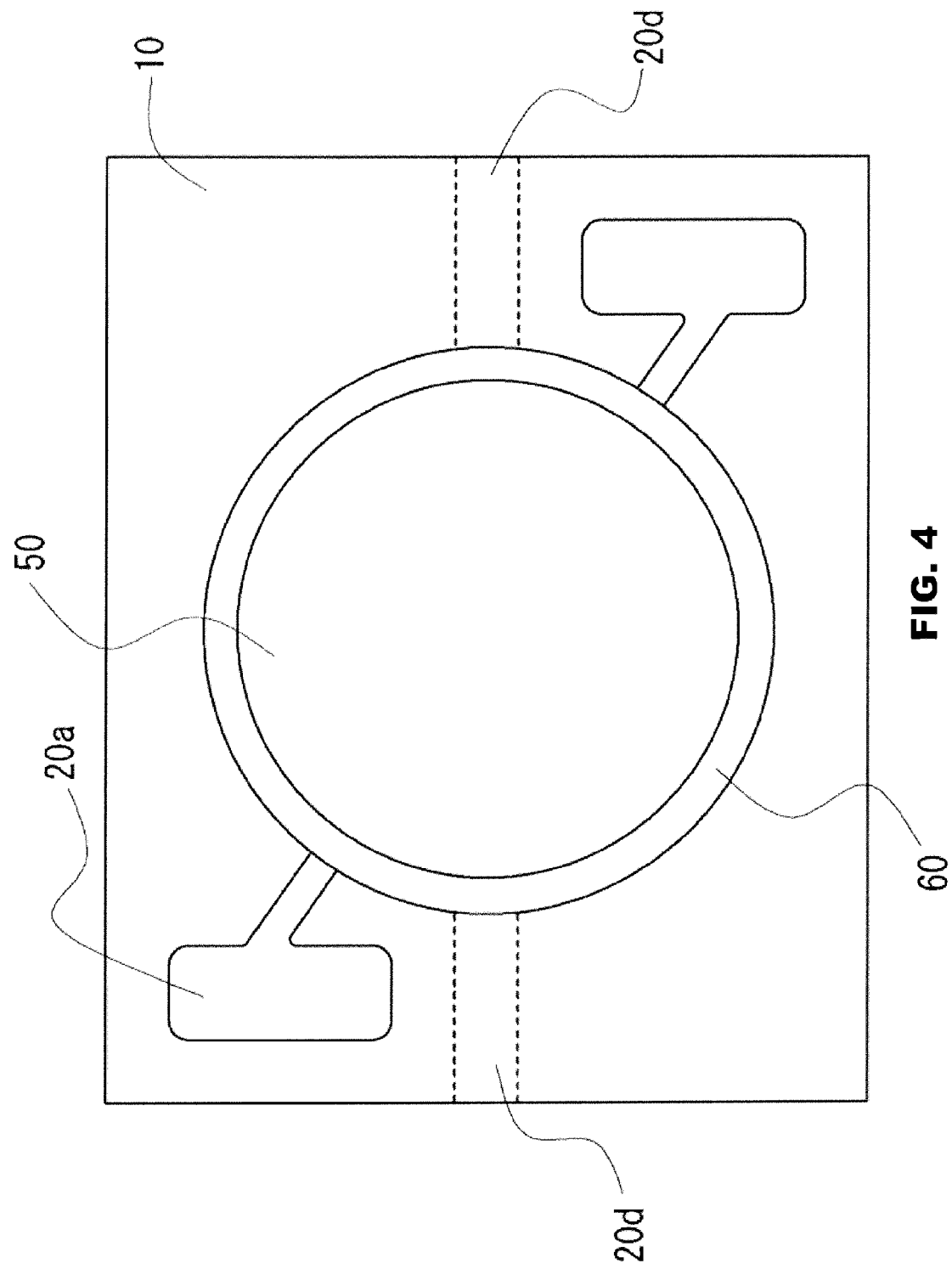
FIG. 4 is an operation diagram of a method of manufacturing a light emitting device according to an embodiment of the present invention, illustrating singulating.
Figure 5:
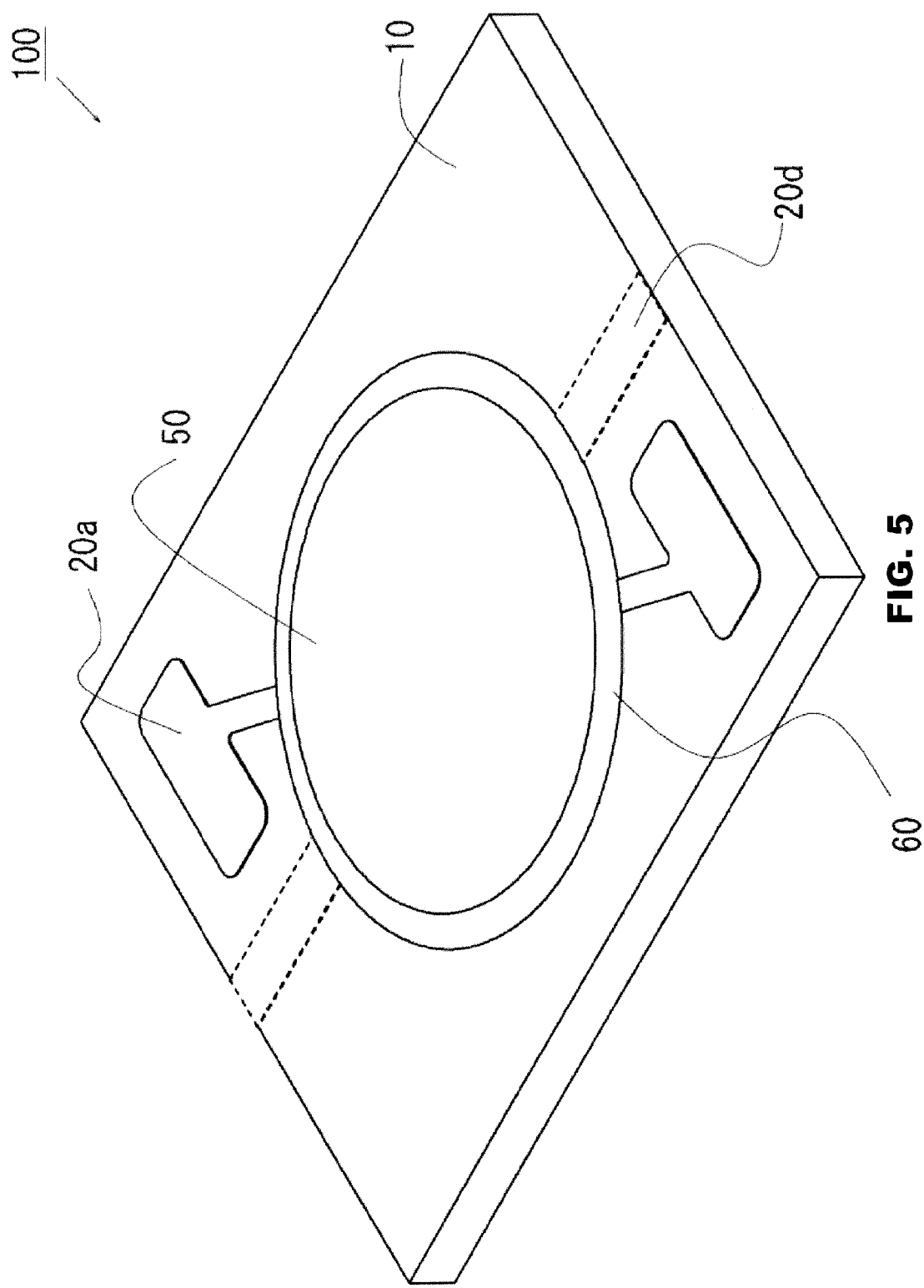
FIG. 5 is a perspective view of a light emitting device according to an embodiment of the present invention.

Preferred embodiments of the present invention will be described below with reference to the accompanying drawings. The preferred embodiments are intended to be illustrative of a light emitting device and a method of manufacturing the light emitting device to give a concrete form to technical ideas of the present invention. The scope of the invention is not limited to those described below.

Further, the members shown in claims attached hereto are not specifically limited to members in the embodiments. The sizes, materials, shapes and the relative configuration etc. of the members described in embodiments are given as an example and not as a limitation to the scope of the invention unless specifically described otherwise. The sizes and the arrangement relationships of the members in each of drawings are occasionally shown exaggerated for ease of explanation. In the description below, the same designations or the same reference numerals denote the same or like members, and duplicative descriptions will be appropriately omitted. Also, a numerical range indicated using "to" in the present specification represents a range including numerical values described before and after "to" as a minimum value and a maximum value, respectively.

In the specification, the term "process" refers not only an independent process but also a process which is indistinguishable from other processes but which can achieve an intended purpose.

A method of manufacturing a light emitting device according to an embodiment of the present invention includes providing an insulating substrate having an electrically conductive member on a surface of the insulating substrate; after providing an insulating substrate, covering the electrically conductive member with a reflecting member by using electrodeposition or electrostatic coating; after covering the electrically conductive member, insulating at least a portion of the electrically conductive member to form an insulating member; and singulating the substrate by cutting. Thus, the electrically conductive member is spaced apart from an end portion of each singulated substrate.

First Embodiment

Each process of a method of manufacturing a light emitting device according to an embodiment of the present invention will be described in detail below.

Providing Substrate

Figure 6:
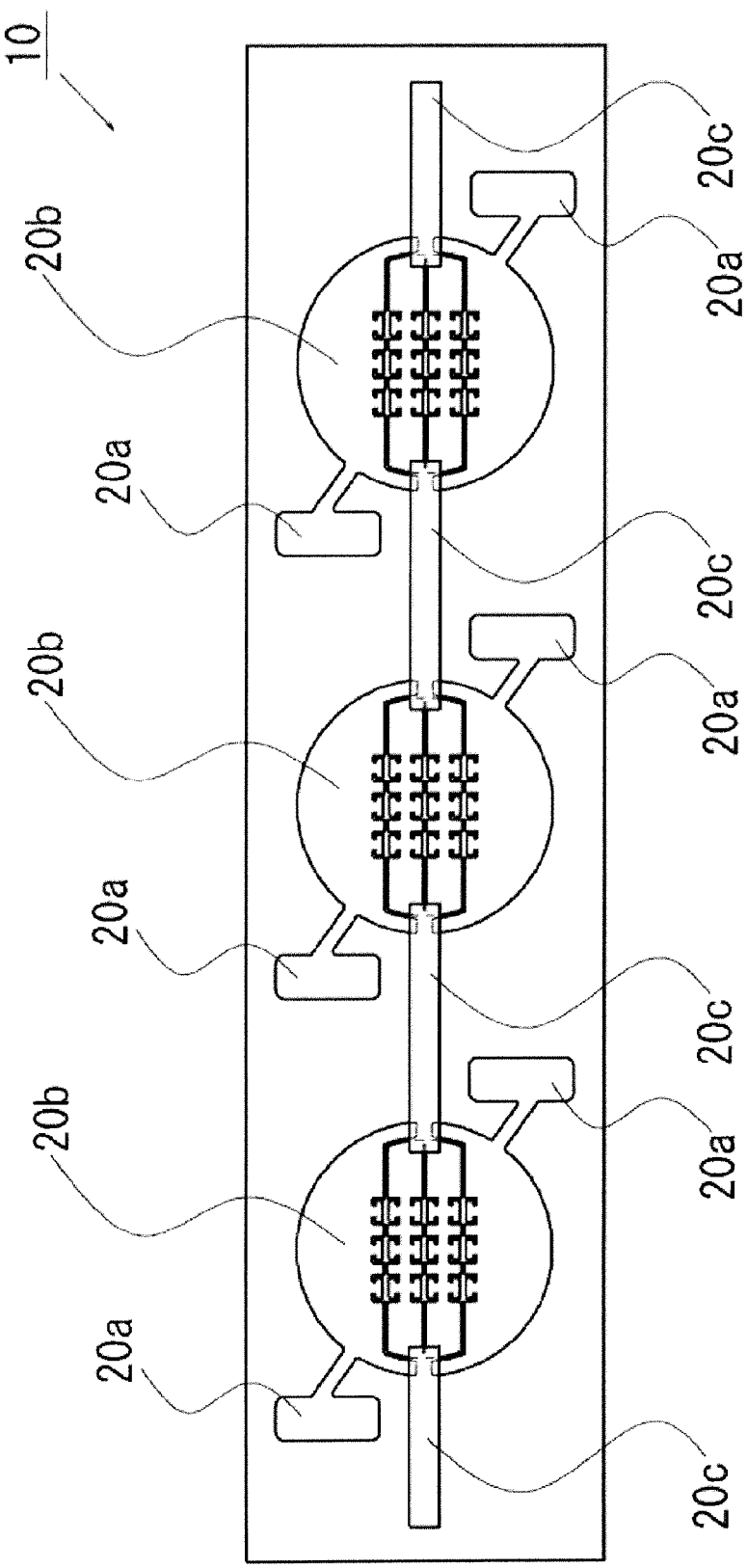
FIG. 6 is a front view of an assembly of substrate members provided in providing an insulating substrate.
Figure 7:
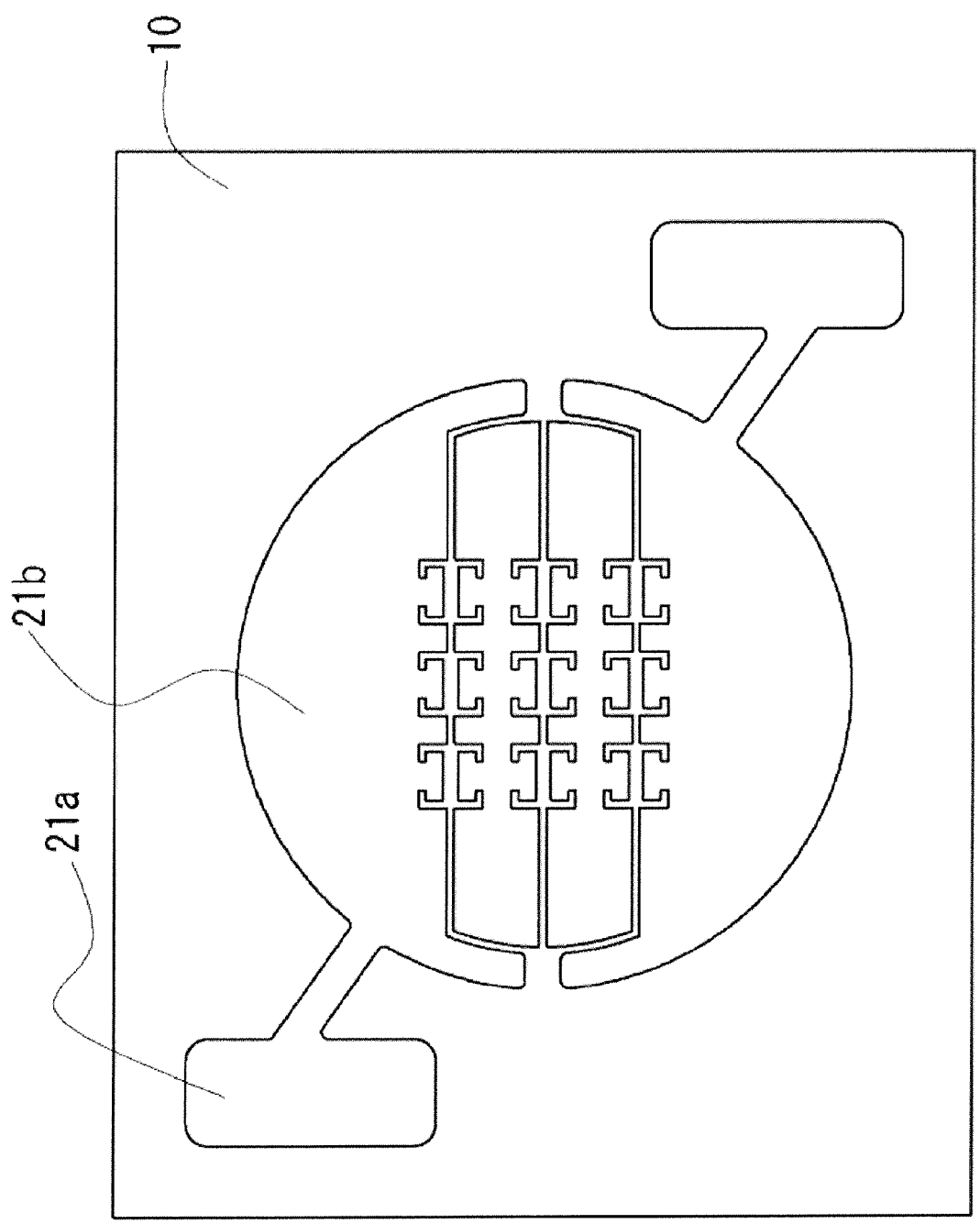
FIG. 7 is an operation diagram of a method of manufacturing a light emitting device according to a second embodiment of the present invention, illustrating providing an insulating substrate.
Figure 8:
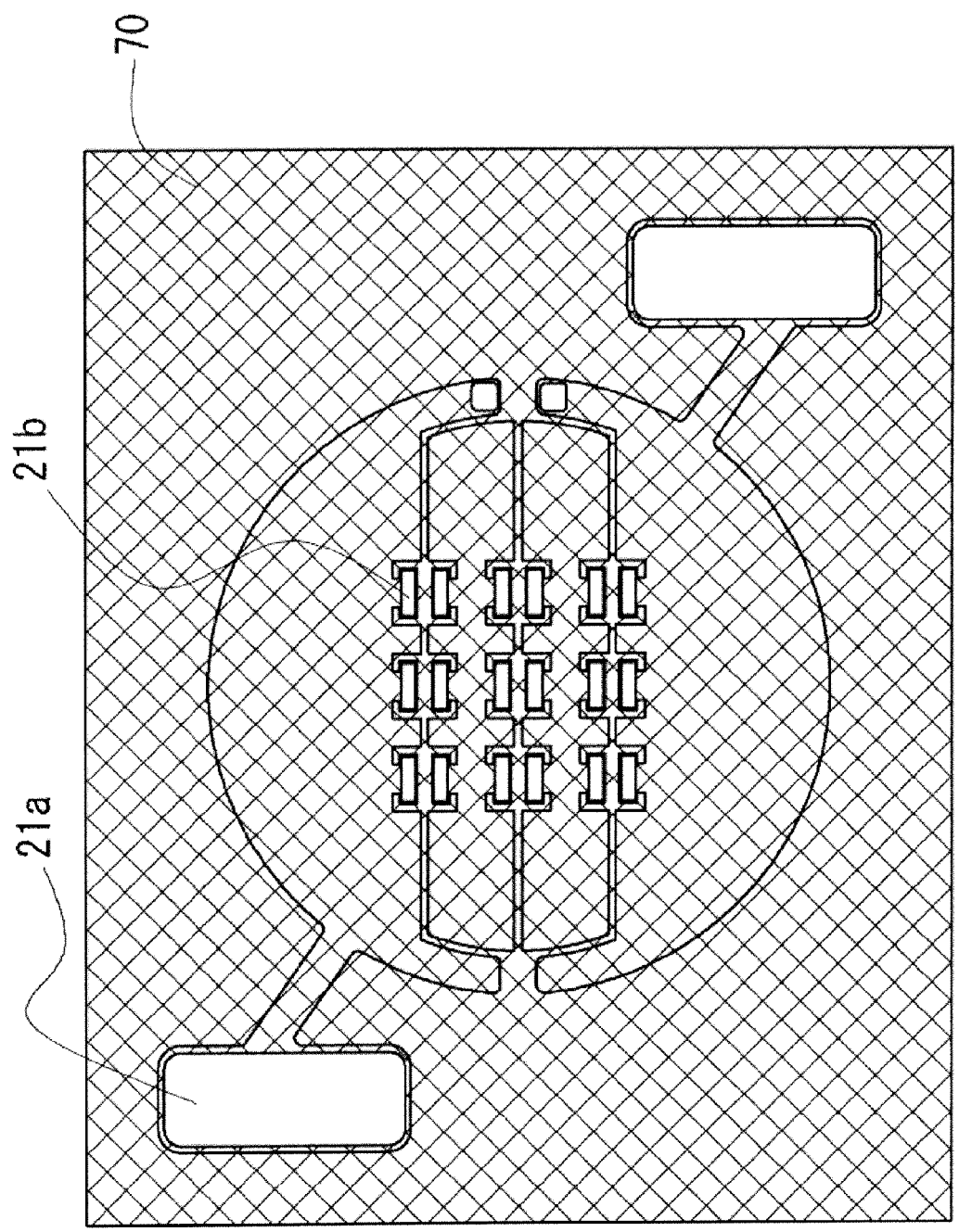
FIG. 8 is an operation diagram of a method of manufacturing a light emitting device according to a second embodiment of the present invention, illustrating disposing an insulating film.
Figure 9:
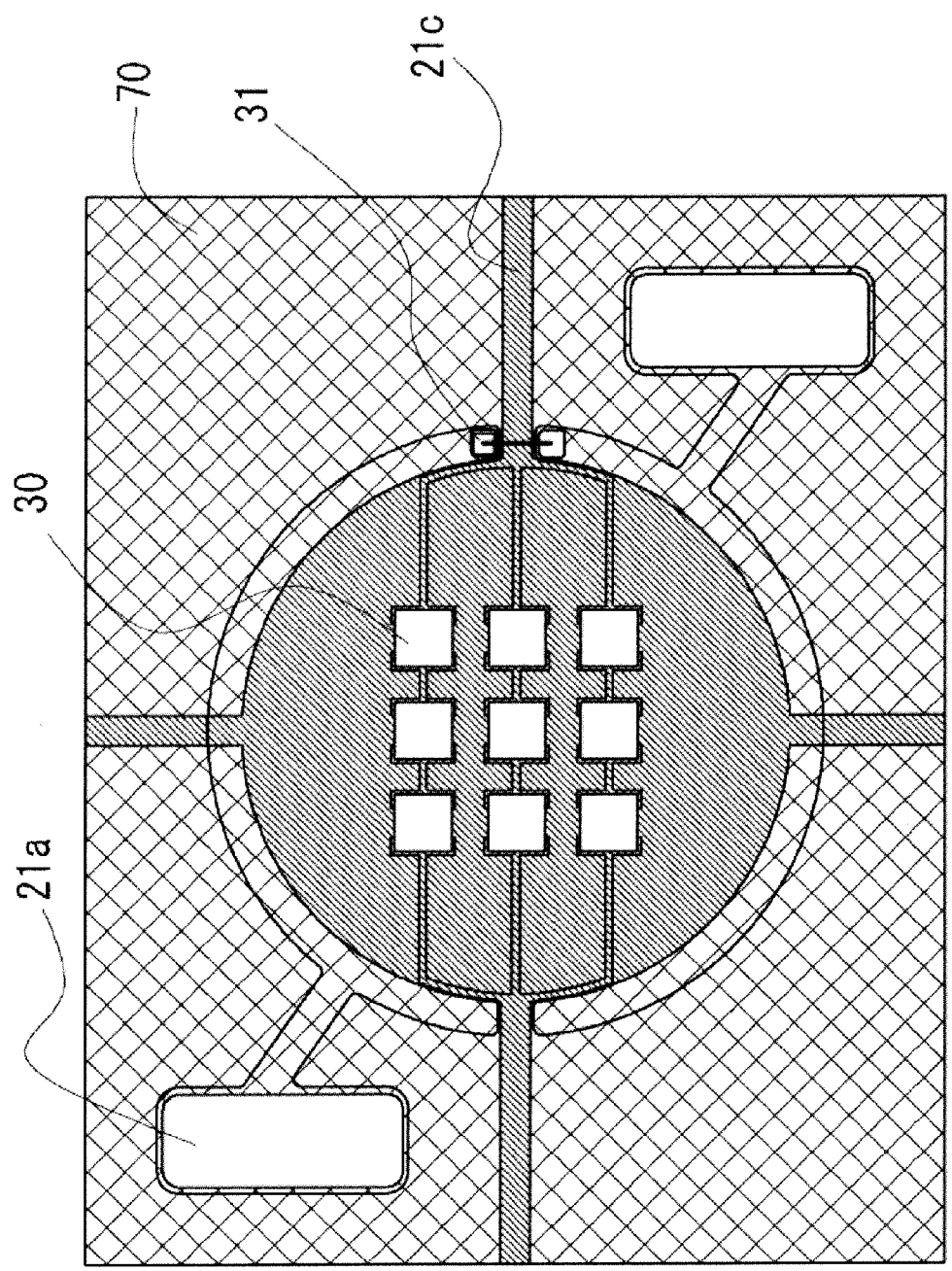
FIG. 9 is an operation diagram of a method of manufacturing a light emitting device according to a second embodiment of the present invention, illustrating disposing an electrically conductive member.
Figure 10:
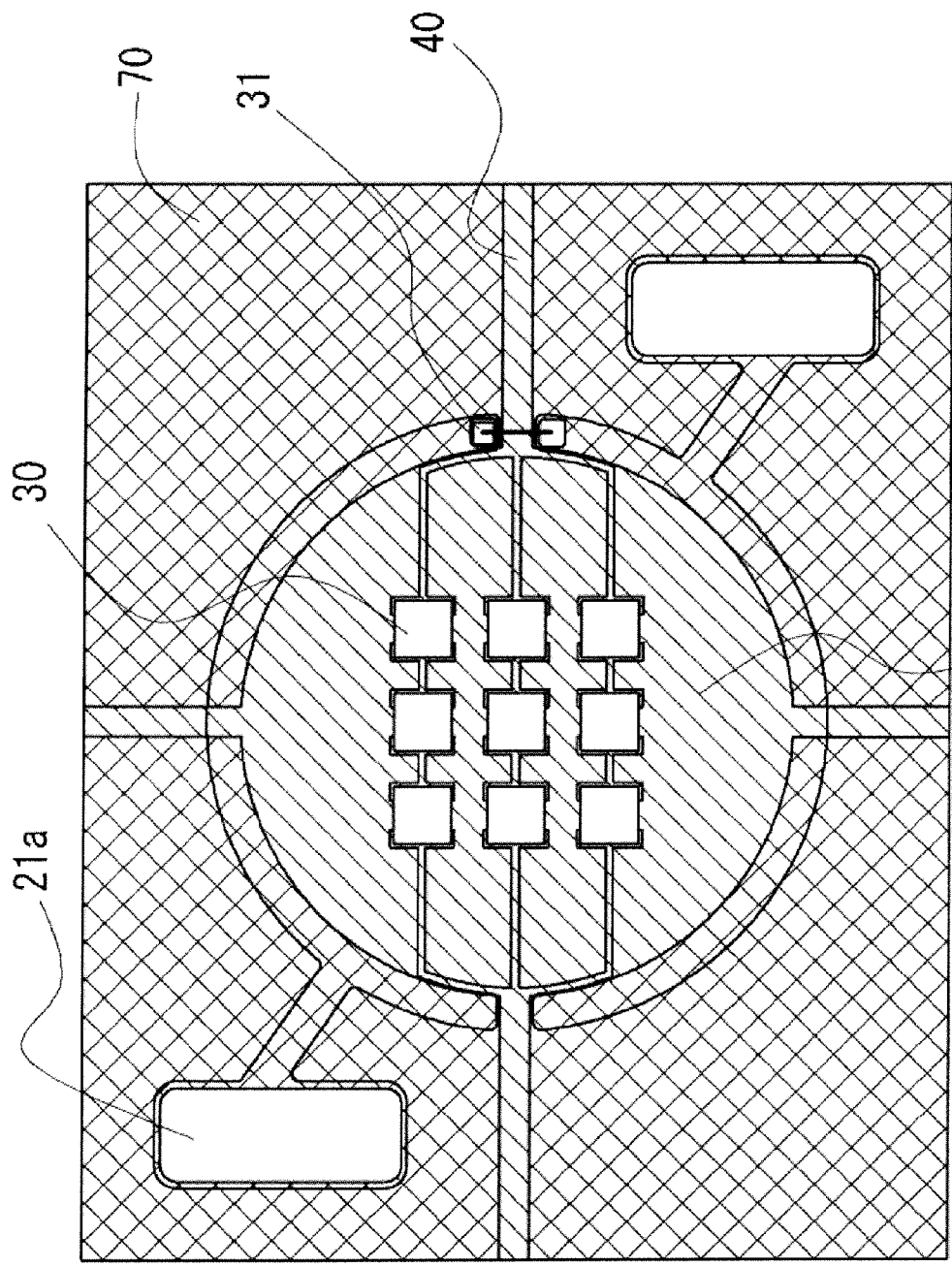
FIG. 10 is an operation diagram of a method of manufacturing a light emitting device according to a second embodiment of the present invention, illustrating covering the electricallt conductive member.
Figure 11:
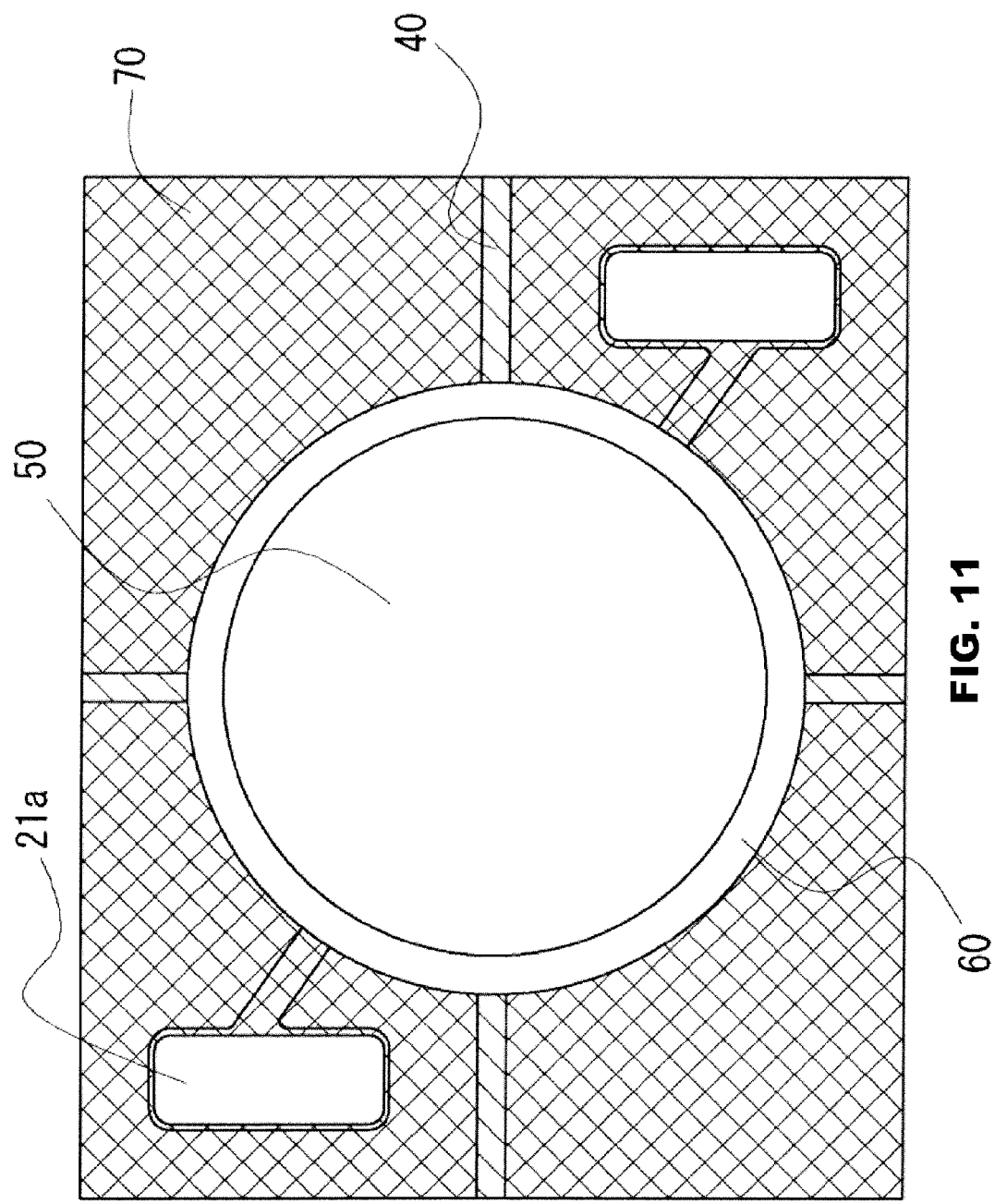
FIG. 11 is an operation diagram of a method of manufacturing a light emitting device according to a second embodiment of the present invention, illustrating washing a reflecting member.

An insulating substrate 10 that has an electrically conductive member is provided. The substrate 10 is a member on which a light emitting element 30 is to be mounted. Each substrate 10 shown in FIG. 1 to FIG. 6 has a planar shape, but a recess such as a so-called "cavity" or the like may be provided. The substrate 10 is in an aggregate state as shown in FIG. 6 until performing singulation through which individual light emitting devices can be obtained. Therefore, a reflecting member can be collectively deposited on a plurality of substrates.

For the material of the substrate 10, an insulating substrate such as a glass epoxy, a resin, or a ceramic (e.g. HTCC, LTCC) can be suitably used. Of those, a ceramic which has high heat resistant property and high weather resistant property can be preferably used. Examples of the ceramic material include alumina, aluminum nitride, and mullite. An insulating material such as a BT resin, a glass epoxy resin, or an epoxy-based resin may combined with such a ceramic material.

The substrate 10 has an electrically conductive member on its upper surface. In the present embodiment, the electrically conductive member includes a terminal portion (20a), a mounting portion (20b), and a connection portion (20c). In the insulating to be performed succeedingly, the connection portion (20c) is insulated. The terminal portion 20a electrically connects a plurality of light emitting elements with the outside to supply electric current and electric power to the light emitting elements 30. That is, the terminal portion 20a serves as an electrode or a part of an electrode for energization from the outside. In the present embodiment, the terminal portion 20a has a pair of positive and negative electrode patterns which are disposed spaced apart from each other on the substrate 10. The mounting portion 20b is a member on which the light emitting elements are mounted in a succeeding operation and then covered with a reflecting member. In the present embodiment, the terminal portion 20a and the mounting portion 20b are disposed continuously, but the terminal portion and the mounting portion may be disposed spaced apart from each other. In the case where the terminal portion and the mounting portion are disposed spaced apart from each other, electrical connection can be established by using a wire or the like.

In the present embodiment, in the insulating at least a portion of the electrically conductive member to be performed succeedingly, the connection portion 20c is insulated and the terminal portion 20a and the mounting portion 20b are not insulated. Accordingly, the terminal portion 20a and the mounting portion 20b are disposed respectively at locations spaced apart from an end portion of the base at the time of being singulated into individual light emitting devices. With this arrangement, an electrically conductive member is not present at an end portion of the substrate in the singulated light emitting device, which allows for securing of the withstand voltage of the light emitting device. In this stage, in the case where an electrically conductive member which is not insulated in a later process is provided on a surface of the substrate, as the terminal portion 20a and the mounting portion 20b in the present embodiment, it is necessary that the formation position of the electrically conductive member is spaced apart from a peripheral edge of the substrate. In more specific terms, the location of the electrically conductive member which is not insulated in a later operation is to be spaced apart from a peripheral edge of the substrate so that a sum of the distance from the peripheral edge and the thickness of the substrate is 1.5 mm or greater, more preferably 2 mm or greater. With this arrangement, the withstand voltage required by various standards such as JIS can be secured. In the light emitting device 100 (FIG. 5) according to the present invention, the substrate has a thickness of 1 mm, and the electrically conductive member (terminal portion) is disposed on the surface of the substrate 1 mm spaced apart from the end portion of the surface. The electrically conductive member or a wiring for electrodeposition are not exposed on an end portion of the surface, the side surfaces, and the back surface, of the substrate 10, which indicates the light emitting device 100 is secured with a sufficient withstand voltage.

The terminal portion 20a and the mounting portion 20b can be made of a material that is known in the art to be appropriate for use with the material that is used for the substrate 10. For example, in the case where a ceramic is used as the material of the substrate 10, it is preferable to use a material such as tungsten and molybdenum which has a high melting point which allows the substrate 10 to be durable to a sintering temperature of a ceramic sheet. Further, a metal film of a single layer or a multilayer may be disposed on the substrate. For example, a simple substance or an alloy of silver, copper, gold, aluminum, rhodium, or the like may be used. It is more preferable to use a single substance of chemically stable gold. The metal film preferably has a thickness of about 0.05 µm to about 50 µm. In the case where the metal film is a multilayer film, the entire thickness is preferably in this range. In the present embodiment, the mounting portion 20b is filled by a reflecting member 40 in a later process, so that degradation of light extraction efficiency can be suppressed without using a material which has an excellent reflectivity.

The connection portion 20c is a member for allowing a collective formation of a reflecting member on the mounting portion, and is insulated in the insulating to be performed in a later operation. The connection portion 20c is also a member for electrically connecting adjacent ones of a plurality of mounting portions 20b in an aggregate state of the substrate 10. In other words, the connection portion 20c is formed continuously to the mounting portion of adjacent substrate in the aggregate of the substrates 10, so that after singulated into individual light emitting devices, a portion of each connecting portion 20c is located at an end portion of the respective substrate. As shown in FIG. 6, a plurality of mounting portions 20b provided on the aggregate of the substrates 10 are electrically connected with each other by the connection portions 20c. With such a configuration, the reflective member can be collectively deposited on a plurality of substrates in the applying the reflecting member which is performed in a later stage.

The connection portion 20c is preferably made of a metal film. Generally, the resistance of a metal tends to increase by oxidization. Forming the connection portion with a thin metal film allows for oxidizing the metal film in a later process to form an insulating member.

Covering Electrically Conductive Member

An electrically conductive member is covered with a reflecting member. The reflecting member can be formed by using electrodeposition method or electrostatic coating method. With the methods described above, the reflecting member 40 can be applied efficiently on the substrates 10 while in their aggregate state.

The reflecting member is preferably an insulating member. The use of an insulating member for the reflecting member allows for ensuring the withstand voltage of the light emitting device even in the case where the connecting portion which is arranged at an end portion of the substrate member is covered with a reflecting member. In the case where an electrically conductive film such as a metal is employed for the reflecting member, the withstand voltage of the light emitting devices can be secured by, for example, disposing a mask on the connection portions so that the reflecting member is not disposed on the ends of the substrates.

Next, a method of applying a reflecting member on the electrically conductive members by using an electrodeposition method will be described. A voltage which has a reverse polarity with respect to the charging polarity of the reflecting member is applied on each of the electrically conductive members on the substrates, and the reflecting member is deposited on the electrically conductive members by using electrophoresis. The thickness of the reflecting member can be appropriately adjusted by the conditions and duration of the deposition. In view of the light extraction efficiency, a thickness of at least 10 µm is preferable.

In the present embodiment, the reflecting member 40 is preferably a white filler, and an inorganic compound is preferably employed for the main component. In the specification, the term "white" refers also a case where the filler itself is transparent but appears white because of scattering under a condition of a difference in the refractive index with that of the material around the filler. Examples thereof include an oxide such as $SiO_2$, $Al_2O_3$, $TiO_2$, $ZrO_2$, $ZnO_2$, $Nb_2O_5$, MgO, SrO, $In_2O_3$, $TaO_2$, HfO, SeO, or $Y_2O_3$, a nitride such as SiN, AlN, or AlON, a fluoride such as $MgF_2$, and at least one of those materials is preferably included in the filler. Such materials may be used either singly or in a mixture. A stacked layer of such materials may also be used. For the filler, a particle diameter in a range of about 1 nm to about 10 µm is preferably employed. Further preferably, a range of about 100 nm to about 5 µm may be employed. With this arrangement, light can be favorably scattered. The filler particles may either have a spherical shape or a fish scale-like shape, but particularly in view of deposition by using electrophoresis, substantially spherical particles are preferable.

In the case where the terminal portions and the mounting portion are formed continuously, as in the present embodiment, a mask may be disposed on the portions designated for the terminal portions, and after forming the reflecting member, etching treatment or the like is performed to expose the terminal portions from the reflecting member.

Insulating Electrically Conductive Member

At least a portion of the electrically conductive member is insulated to form an insulating member. In the present embodiment, the electrically conductive member includes a terminal portion 20a, a mounting portion 20b, and a connection portion 20c, and in the insulating, the connection portion 20c is insulated. The following method will illustrate a method of oxidizing a metal layer, but the method of insulating the electrically conductive member is not specifically limited.

The connection portion 20c is preferably made of a metal film. The connection portion made of a metal film can be made into an insulating member through oxidation. Examples of materials which have electroconductivity and which can be made insulating in a later operation include a metal material which includes at least one element selected from a group consisting of Mg, Al, Zn, Pb, Sn, and In; among those, Al is preferably used singly. Al can be oxidized by exposing it to a high temperature and a high humidity for a certain period of time to form $Al_2O_3$. $Al_2O_3$ has a high electric insulation property, so that even in the case where an $Al_2O_3$ film is located at an end portion of a singulated substrate, the withstand voltage of the light emitting device can be secured. In this case, the Al (aluminum) film preferably has a thickness of 0.1 µm or less.

In the insulating, in addition to the connection portions 20c, the mounting portions 20b can also be insulated. The mounting portions 20b can be insulated in the insulating, as long as the electrical connection between the light emitting elements and the corresponding terminal portions 20a are secured. In this case, in the case where the mounting portions 20b and the connection portions 20c are formed with a same metal film, insulating can be carried out at the same time in the insulating. However, the terminal portions 20a which serve as electrodes of the singulated individual light emitting devices are preferably made of a material which is different from that of the connection portions 20c so that the terminal portions 20a are not insulated in the insulating.

Singulating

The substrate is singulated. In the present embodiment, the collective substrate is cut at positions that each includes the connection portion 20c but does not include the electrically conductive portion so that the electrically conductive members are spaced apart from the end portions of the singulated light emitting device. Various methods can be employed for singulating an aggregate substrate. Examples of such methods include dicing with a blade and dicing with a laser beam. In the present embodiment, the singulating is not necessarily performed after the insulating. In the case where an aluminum film is employed for the connection portions as in the present embodiments, since aluminum can be insulated under conditions of high temperature, high humidity, and high pressure, the substrate can be insulated under the same conditions in either a collective state or a singulated state. However, in the case where the insulating is performed before the singulating, if the connection portion is an aluminum film in its non-oxidized state, a soft metal such as aluminum may extend at the time of cutting and may result in burrs. For this reason, the singulating is preferably performed after the insulating. Also, in view of mass-productivity, insulating in a state of a collective substrate is more preferable than insulating in a state of a singulated substrate. At the time of singulation, cutting is performed at positions that each includes the connection portion but does not include the electrically conductive portion so that the electrically conductive members are spaced apart from the end portions of the singulated light emitting device. Thus, the required withstand voltage of the light emitting device can be secured.

Mounting Light Emitting Element

In the present embodiment, before covering the electrically conductive member, mounting a light emitting element on the mounting portion is performed. In the present embodiment, the light emitting element 30 is placed so that the electrode forming surface faces the mounting portion 20b, and the back-surface side (opposing the electrode forming surface) is its main light extracting surface. The light emitting element 30 is mounted in a flip-chip manner via a bonding member to be described below. Flip-chip mounting of the light emitting element eliminates the need of a wire in connecting of the electrode, which eliminates optical absorption by the wire. Accordingly, emitted light can be extracted efficiently. In addition to the configuration described above, a face-up mounting type can also be employed, in which the electrode forming surface side which is at an opposite side of the mounting surface side to the substrate is designated as its main light extracting surface.

The number of the light emitting elements is not specifically limited, and either a single light emitting element or a plurality of light emitting elements can be used. In the case where the light emitting device which employs a plurality of light emitting elements is to serve as a point light source, adjacent light emitting elements are arranged closely with each other, so that the individual light sources (i.e. light emitting elements) are preferably arranged as closely with each other as possible. Alternatively, in the case where the light emitting device which employs a plurality of light emitting elements is to serve as a planar light source, adjacent light emitting elements are arranged somewhat spaced apart from each other so that light can be extracted uniformly.

In the present embodiment, light emitting diodes are preferably employed for the light emitting elements 30, which allows selection of an appropriate wavelength. For example, a light emitting element for emitting light of a blue color (emission wavelength of 430 nm to 490 nm) or a green color (emission wavelength of 490 nm to 560 nm), ZnSe, a nitride-based semiconductor (In$_X$Al$_Y$Ga$_{1-X-Y}$N, $0 \le X$, $0 \le Y$, $X+Y \le 1$), GaP etc., can be used.

A bonding member is for electrically connecting the light emitting element 30 to the electrically conductive member (mounting portion) 20b, and also for adhering the light emitting element 30 to the substrate 10. For the bonding member, an electrically conductive material may be used. Specific examples of such a material include an electrically conductive paste of such as Au, Ag, or Pd, an Au-containing alloy, an Ag-containing alloy, a Pd-containing alloy, an In-containing alloy, a Pd—Pd containing alloy, an Au—Ga containing alloy, an Au—Sn containing alloy, a Sn containing alloy, an Au—Ge containing alloy, an Au—Si containing alloy, an Al-containing alloy, a Cu—In containing alloy, and a mixture of a metal and a flux. For the bonding member, a liquid-state, a paste-state, or a solid-state (e.g. a sheet-state, a block-state, powder-state) can be employed, which can be appropriately selected according to the composition and to the shape of the substrate 10, or the like. Those bonding members may be formed of a single member, or of a combination of plural kinds of members.

For example, in the case where the light emitting element is mounted in a face-up manner, electrical connection with the terminal portion can be established with the use of a wire. At this time, the bonding member is not needed to be electrically conductive and a resin such as an epoxy resin or a silicone resin can be appropriately selected.

The method of manufacturing a light emitting device according to the present embodiment may further include operations as described below.

Forming Resin Frame

A resin frame 60 is formed on the substrate 10. The forming of the resin frame is preferably performed after the insulating. The resin frame 60 can be used as a frame body which surrounds the mounting portion 20b, allows disposing the light emitting element 30 inside of the frame, and holds in the sealing member 50 which seals the light emitting element 30. The resin frame 60 can reflect the light emitted from the light emitting element 30. In the case where a protective element and wires connected to the protective element and so forth are arranged on the mounting portion 20b, the resin frame 60 is formed to cover those. Thus, even in the case where Au and/or a Si semiconductor which easily absorb light are employed, light emitted from the light emitting element 30 can be reflected at the resin frame 60 before reaching the protective element and the wire. Accordingly, the light extraction efficiency of the light emitting device 100 can be improved.

For the material of the resin frame, an insulating material can be preferably used. In order to secure a certain degree of mechanical strength, for example, a thermosetting resin, a thermoplastic resin, and so forth can be used. Specific Examples thereof include a phenol resin, an epoxy resin, a BT resin, a PPA, and a silicone resin. Also, fine particles or powder of a reflecting member (for example, $TiO_2$, $Al_2O_3$, $ZrO_2$, MgO) or the like, which hardly absorb light from the light emitting element 30 and have a large refractive index difference relative to the matrix resin may be dispersed in the matrix resin such as described above, to obtain efficient reflection of light. The dimensions of the resin frame are not specifically limited and can be appropriately selected according to the intent and application.

Disposing Sealing Member

After the forming resin frame, disposing a sealing member which seals the light emitting element 30 and a surface of the reflecting member 40 can be performed. The sealing member is to protect the light emitting element 30, the reflecting member 40, and so forth which are disposed on the substrate 10, from dust, moisture, external force, or the like. Examples of the material of the sealing member include a silicone resin, an epoxy resin, a urea resin, a fluororesin, a modified silicone resin, a modified epoxy resin, and a glass. In addition to the materials described above, a coloring agent, a light-diffusion agent, a filler, or the like, can be contained in the sealing member when necessary. The sealing member has a high refractive index which allows for an increase in the amount of light extraction of the light emitted from the light emitting element 30. The sealing member may be a single layer made of a single material or a single layer made of a mixture of two or more materials or members, or a stacked layer made of two or more single layers. In the case where two or more layers are stacked, the resin frame may be provided with two or more levels. A light transmissive member with a lens function may be used. For example, the sealing member may be mounded to form a concave-lens shape.

For the formation method of the sealing member, a method known in the art to be used at the time of sealing a light emitting element can also be used. Examples thereof include a potting method in which a liquid resin is applied by potting and then hardened, compression molding, injection molding, and printing.

In a method of manufacturing a light emitting device according to the present embodiment, a fluorescent material and/or a light-diffusion agent, or the like may be contained in the sealing member. For the fluorescent material, a known material in the art can be used. Specific examples of the fluorescent materials include a yttrium aluminum garnet (YAG)-based fluorescent material activated with cerium, a lutetium aluminum garnet (LAG)-based fluorescent material activated with cerium, a nitrogen-containing calcium aluminosilicate (CaO—Al2O3-SiO2) fluorescent material activated with europium and/or chromium, and a silicate fluorescent material activated with europium ((Sr,Ba)2SiO4). Accordingly, a light emitting device to emit light of mixed color having a visible wavelength (for example, a while light) of primary light and secondary light, or a light emitting device to emit secondary light having a visible wavelength upon being excited by primary light in the ultraviolet region can be obtained. Particularly, for the fluorescent material to be used in combination with a blue light emitting element to emit white light, a fluorescent material which can be excited by a blue light and emits yellow light with broad spectrum may be preferably used.

A plurality of types of fluorescent materials may be used in combination. For example, color rendering properties and/or color reproducibility can also be adjusted with employing a combination and a mixing ratio suitable for a desired color tone through appropriately selecting a plurality of fluorescent materials from a group such as Si6−ZAlZOZN8−Z:Eu, Lu3Al5O12:Ce, BaMgAl10O17:Eu, BaMgAl10O17:Eu, Mn, (Zn,Cd)Zn:Cu, (Sr,Ca)10(PO4)6C12:Eu,Mn, (Sr,Ca)2Si5N8:Eu, CaAlSiBXN3+X:Eu, K2SiF6:Mn, and CaAlSiN3:Eu.

Examples of diffusion agents include silica, titanium oxide, zirconium oxide, magnesium oxide, carbonate magnesium, magnesium hydroxide, calcium carbonate, calcium hydroxide, calcium silicate, zinc oxide, barium titanate, aluminum oxide, iron oxide, chromium oxide, manganese oxide, glass, carbon black, crystal or sintered body of a fluorescent material, sintered body of an inorganic fluorescent material and a binding agent.

Disposing Fluorescent Material Layer

In a method of manufacturing a light emitting device according to the present embodiment, in addition to adding a fluorescent material in the sealing member, disposing a fluorescent layer can be performed separately from disposing sealing member. The disposing of the fluorescent material includes disposing a fluorescent material layer which includes a fluorescent material on an upper surface of the light emitting element 30 and maybe performed before the process of disposing the sealing member.

The method of disposing the fluorescent material layer is not specifically limited and for example, a splay method, an electrodeposition method, or an electrostatic coating method can be used. Alternatively, a fluorescent material sheet made of a material in which a fluorescent material is dispersed in a resin is formed and adhered to the light emitting element by using an adhesive agent. For the fluorescent material, as described above, a known material in the art can be used.

Mounting Protective Element

In the present embodiment, mounting of a protective element may be performed as needed. An example of the protective element is a Zener diode. Mounting of the protective element is preferably performed before covering the electrically conductive member with a reflecting member so that the protective element and the electrically conductive member are electrically connected. For connecting the protective element and the electrically conductive member, a wire may be used.

Washing Reflecting Member

In a method of manufacturing a light emitting device according to the present embodiment, washing of the reflecting member may be performed after disposing the sealing member. In washing the reflecting member, the reflecting member which is exposed from the sealing member is removed. For example, the washing of the reflecting member includes, after insulating at least a portion of the electrically conductive member, removing the reflecting member which covers the insulating member (connection portion) 20d. The washing of the reflecting member may be performed after singulating, but is preferably performed before singulating. It is preferable that the washing of the reflecting member is performed before the singulating, because this allows the reflecting member not to be cut at the time of cutting the substrate, so that detachment of the reflecting member at the time of cutting, which may result in attaching of the detached reflecting member to the cut surface, can be avoided.

Other Operations

In the method of manufacturing a light emitting device according to present embodiment, within a range without having an adverse effect on each operation, one or more operations which have not been described above may be included between the operations or before or after each operation. For example, one or more other operations such as washing the substrate, removing unnecessary substances such as dust, and/or adjusting a mounting position of the light emitting element and/or the protective element, may be included.

Second Embodiment

Next, a light emitting device according to the second embodiment will be described. A method of manufacturing a light emitting device according to a second embodiment can be performed in a similar manner as in the first embodiment, except that, between the step of providing a substrate and the step of covering, steps of disposing an insulating film and disposing an electrically conductive member are performed. More specifically, the method can be performed as described below.

Providing Substrate 10

The first process includes providing an insulating substrate 10 which has an electrically conductive member. The substrate 10 has an electrically conductive member on its surface. The electrically conductive member includes terminal portions 21a and a mounting portion 21b. The terminal portions 21a and the mounting portion 21b are not insulated in the later step of insulating the electrically conductive member.

Disposing Insulating Film

An insulating film 70 is disposed on the substrate 10. The insulating film 70 covers an upper surface of the substrate 10. Covering is carried out so as to expose at least a portion of the terminal portions 21a and at least a portion of the mounting portion 21b, so that at least a portion of the terminal portions 21a and at least a portion of the mounting portion 21b are not covered with the insulating film. In the specification, the expression "at least a portion" refers more specifically to a region of the mounting portion 21b which are directly connected to the corresponding light emitting element, and a region of the terminal portions 21a which to serve as external connection terminals to supply external electricity to the light emitting element.

Disposing Electrically Conductive Member

A connection portion 21c is disposed on an insulating film. On the connection portion 21c, a reflecting member is disposed in a subsequent step of covering the electrically conductive member.

Covering Electrically Conductive Member

The electrically conductive member (connection portions 21c) which is disposed in the step of disposing the electrically conductive member is covered with a reflecting member by way of electrodeposition or electrostatic coating.

Insulating Electrically Conductive Member

After the covering, the electrically conductive member (connection portions 21c) is insulated to form an insulating member.

Singulating

The substrate is cut into individual pieces.

According to a method of manufacturing a light emitting device according to the second embodiment, an arrangement of the connection portions 21c to be insulated in later operation, the terminal portions 21a and the mounting portion 21b may be arranged spaced apart from each other. That is, with the use of an insulating film interposed therebetween, the connection portions and the terminal portions, and the connection portions and the mounting portion can be respectively overlapped with each other in three dimensions, i.e. a three-dimensional. This facilitates disposing of the reflecting member on a desired location. Further, the connection portions 21c and the terminal portions 21a are spaced apart from each other, so that individual light emitting devices can be turned on in the collective substrate state without insulating the electrically conductive members in the third process which includes insulating. This allows for conducting evaluation testing on the luminance and chromaticity, immediately after disposing the sealing member. Thus, a yield of the light emitting device can be improved.

Also, in a method of manufacturing a light emitting device according to the second embodiment, further operations as described above such as mounting a light emitting element, forming a resin frame, disposing a sealing member, disposing a fluorescent material layer, disposing a protective member, and washing a reflecting member, or the like can be performed.

The light emitting device according to the present invention can be used for various kinds of light sources, such as illumination light sources, light sources for various kinds of indicators, light sources for automobile use, light sources for displays, back light sources for liquid crystal displays, light sources for sensors, and signals.

It is to be understood that although the present invention has been described with regard to preferred embodiments thereof, various other embodiments and variants may occur to those skilled in the art, which are within the scope and spirit of the invention, and such other embodiments and variants are intended to be covered by the following claims.

What is claimed is:

1. A method of manufacturing a light emitting device, the method comprising:
    providing an insulating substrate having an electrically conductive member on a surface of the insulating substrate;
    mounting a light emitting element on the mounting portion;
    after mounting the light emitting element on the mounting portion, covering the electrically conductive member with a reflecting member by using electrodeposition or electrostatic coating;
    after covering the electrically conductive member with the reflecting member, oxidizing a portion of the electrically conductive member to form an insulating member; and
    singulating the substrate by cutting the substrate to form a plurality of singulated substrates, wherein the substrate is singulated such that, in each singulated substrate, the electrically conductive member is spaced apart from end portions of the singulated substrate,
    wherein the cutting of the substrate includes cutting the insulating member that was formed by oxidizing said portion of the electrically conductive member, and
    wherein the reflective member comprises a white filler.

2. The method of manufacturing a light emitting device according to claim 1, wherein the singulating is performed after the insulating of the portion of the electrically conductive member to form the insulating member.

3. The method of manufacturing a light emitting device according to claim 1,
    wherein, in the step of providing the insulating substrate, the electrically conductive member comprises a mounting portion and a connection portion, and
    wherein the step of covering the electrically conductive member with the reflecting member comprises covering the mounting portion with a reflecting member.

4. The method of manufacturing a light emitting device according to claim 3, wherein in the step of oxidizing at least a portion of the electrically conductive member, the connection portion is oxidized.

5. The method of manufacturing a light emitting device according to claim 4, wherein the connection portion is made of a metal film and the connection portion is insulated by oxidizing the metal film.

6. The method of manufacturing a light emitting device according to claim 3, wherein the mounting portion and the connection portion are arranged overlapping with each other via an insulating film.

7. The light emitting device according to claim 1, wherein the reflecting member is an insulating member.

8. The method of manufacturing a light emitting device according to claim 7, further comprising:
   before singulating the substrate, washing the reflecting member.

9. The method of manufacturing a light emitting device according to claim 1, wherein the white filler comprises $SiO_2$, $Al_2O_3$, $TiO_2$, $ZrO_2$, $ZnO_2$, $Nb_2O_5$, MgO, SrO, $In_2O_3$, $TaO_2$, HfO, SeO, or $Y_2O_3$, SiN, MN, AlON, and/or $MgF_2$.

10. The method of manufacturing a light emitting device according to claim 1, wherein the white filler comprises particles having a particle diameter in a range of 100 nm to 5 μnm.

11. The method of manufacturing a light emitting device according to claim 1, wherein the electrically conductive member comprises Mg, Al, Zn, Pb, Sn, and/or In.

12. The method of manufacturing a light emitting device according to claim 1, wherein the electrically conductive member comprises Al.

13. The method of manufacturing a light emitting device according to claim 12, wherein the conductive member has a thickness of 0.1 μm or less.

\* \* \* \* \*